United States Patent
Zhou et al.

(10) Patent No.: US 10,202,544 B2
(45) Date of Patent: Feb. 12, 2019

(54) LIGHT-DIFFUSION POWDER, QUANTUM-DOT-CONTAINING PHOTORESIST, AND QUANTUM-DOT-CONTAINING COLOR FILM, AND PREPARATION METHODS

(71) Applicant: BOE TECHNOLOGY GROUP CO., LTD, Beijing (CN)

(72) Inventors: Tingting Zhou, Beijing (CN); Bin Zhang, Beijing (CN); Yonglian Qi, Beijing (CN); Dini Xie, Beijing (CN); Yong Jiang, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/523,477

(22) PCT Filed: Nov. 16, 2016

(86) PCT No.: PCT/CN2016/106048
§ 371 (c)(1),
(2) Date: May 1, 2017

(87) PCT Pub. No.: WO2017/185717
PCT Pub. Date: Nov. 2, 2017

(65) Prior Publication Data
US 2018/0187071 A1    Jul. 5, 2018

(30) Foreign Application Priority Data

Apr. 26, 2016   (CN) .......................... 2016 1 0266767

(51) Int. Cl.
*G03F 7/004*    (2006.01)
*C09K 11/02*    (2006.01)
(Continued)

(52) U.S. Cl.
CPC ............ *C09K 11/025* (2013.01); *C08G 77/18* (2013.01); *G02B 1/04* (2013.01); *G03F 7/0007* (2013.01);
(Continued)

(58) Field of Classification Search
CPC .......... C09K 11/025; G02B 1/04; G02B 5/02; G02B 5/0268; G02B 5/0273; G02B 5/201;
(Continued)

(56) References Cited

U.S. PATENT DOCUMENTS

| 2009/0087792 | A1 | 4/2009 | Iizumi et al. | |
| 2011/0090568 | A1* | 4/2011 | Hamamoto | A61K 8/895 |
| | | | | 359/599 |
| 2011/0240936 | A1* | 10/2011 | Saito | C08G 77/04 |
| | | | | 252/582 |

FOREIGN PATENT DOCUMENTS

| CN | 103275617 A | * | 9/2013 |
| CN | 103936935 A | | 7/2014 |

(Continued)

OTHER PUBLICATIONS

Computer-generated translation of CN 103275617 (Sep. 2013).*
(Continued)

*Primary Examiner* — John A McPherson
(74) *Attorney, Agent, or Firm* — Anova Law Group, PLLC

(57) ABSTRACT

The present disclosure provides a light-diffusion powder, a quantum-dot-containing photoresist, and a quantum-dot-containing color film, and their preparation methods. The light-diffusion powder is obtained from an alkoxysilane having a chemical structure represented by formula (I):

(Continued)

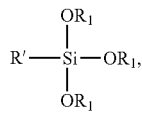

(I)

where $R_1$ includes a C1~C50 alkyl group, and R' includes one or more of an alkyl and a substituted alkyl group.

20 Claims, 5 Drawing Sheets

(51) Int. Cl.

| | | |
|---|---|---|
| C08G 77/18 | (2006.01) | |
| G03F 7/033 | (2006.01) | |
| G03F 7/038 | (2006.01) | |
| G02B 1/04 | (2006.01) | |
| G03F 7/00 | (2006.01) | |
| G03F 7/031 | (2006.01) | |
| G03F 7/075 | (2006.01) | |
| G03F 7/16 | (2006.01) | |
| G03F 7/20 | (2006.01) | |
| G03F 7/26 | (2006.01) | |
| G03F 7/027 | (2006.01) | |
| C09K 11/56 | (2006.01) | |
| C09K 11/88 | (2006.01) | |
| G02F 1/1335 | (2006.01) | |

(52) U.S. Cl.
CPC .......... *G03F 7/0043* (2013.01); *G03F 7/0047* (2013.01); *G03F 7/027* (2013.01); *G03F 7/031* (2013.01); *G03F 7/033* (2013.01); *G03F 7/038* (2013.01); *G03F 7/0757* (2013.01); *G03F 7/0758* (2013.01); *G03F 7/16* (2013.01); *G03F 7/20* (2013.01); *G03F 7/2053* (2013.01); *G03F 7/26* (2013.01); *C09K 11/565* (2013.01); *C09K 11/883* (2013.01); *G02F 1/133617* (2013.01); *G02F 2202/36* (2013.01)

(58) Field of Classification Search
CPC ....... G02B 5/206; B82Y 20/00; G03F 7/0007; G03F 7/031; G03F 7/028; C08G 77/18
USPC .......................... 430/270.1, 281.1; 359/599
See application file for complete search history.

(56) References Cited

FOREIGN PATENT DOCUMENTS

| | | |
|---|---|---|
| CN | 105093830 A | 11/2015 |
| CN | 105242442 A | 1/2016 |
| JP | H04202325 A | 7/1992 |

OTHER PUBLICATIONS

The World Intellectual Property Organization (WIPO) International Search Report and Written Opinion for PCT/CN2016/106048 dated Jan. 25, 2017 12 Pages.
State Intellectual Property Office of the P.R.C (SIPO) Office Action 1 for 201610266767.8 dated Mar. 5, 2018 17 Pages.
State Intellectual Property Office of the P.R.C (SIPO), Office Action 2 for 201610266767.8, dated Sep. 28, 2018, 36 Pages.
Dar-Jong Lin, "Preparation of a Nanosilica-Modified Negative-Type Acrylate Photoresist", Journal of Applied Polymer Science, vol. 107, Oct. 9, 2007 (Oct. 9, 2007), p. 1179-1188.

* cited by examiner

LIGHT-DIFFUSION POWDER, QUANTUM-DOT-CONTAINING PHOTORESIST, AND QUANTUM-DOT-CONTAINING COLOR FILM, AND PREPARATION METHODS

CROSS-REFERENCES TO RELATED APPLICATION

This application is a national phase entry under 35 U.S.C. § 371 of International Application No. PCT/CN2016/106048, filed on Nov. 16, 2016, which claims the priority to Chinese Patent Application No. 201610266767.8, filed on Apr. 26, 2016. The above enumerated patent applications are incorporated by reference herein in their entirety.

TECHNICAL FIELD

The present disclosure generally relates to display technologies and, more particularly, relates to a light-diffusion powder, a quantum-dot-containing photoresist, and a quantum-dot-containing color film, and their preparation methods.

BACKGROUND

Conventional liquid crystal display device includes a white backlight source to display colors. Generally, a color film substrate is configured with a color filter layer. However, because backlight loses nearly 70% brightness when passing through the color filter layer, the color filter layer contributes most in backlight brightness loss. In recent years, due to superior light emitting characteristics and wide color gamut, quantum dot light emitting diodes (LEDs) are often widely used in display devices. Quantum dot LEDs may have a similar structure as polymer LEDs. In addition, a light emitting layer of quantum dot LEDs often includes a quantum-dot-containing color film.

Quantum-dot-containing color film technology uses quantum dots, instead of conventional color pigments, to be mixed into a photoresist to form a color conversion film. However, quantum dots are prone to agglomeration or are sometimes quenched. Quantum dots are high in cost and low in light emission efficiency. In addition, a quantum-dot-containing color film does not have a desired thickness, which causes a large amount of blue backlight being wasted by exiting the color film without having sufficient interaction with quantum dots and subsequent conversion to red light and green light. Thus, light transmittance is low and brightness is reduced.

The disclosed light-diffusion powder, quantum-dot-containing photoresist, and quantum-dot-containing color film are directed to at least partially alleviate one or more problems set forth above and to solve other problems in the art.

SUMMARY

The present disclosure provides a light-diffusion powder, a quantum-dot-containing photoresist, and a quantum-dot-containing color film, and their preparation methods.

One aspect of the present disclosure provides a light-diffusion powder, obtained from an alkoxysilane having a formula (I):

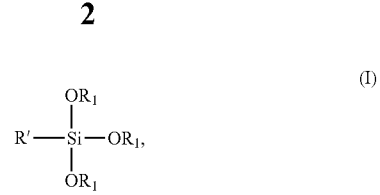

wherein $R_1$ includes a C1~C50 alkyl group, and R' includes an alkyl, a substituted alkyl group, and a combination thereof.

Optionally, the R' has a formula:

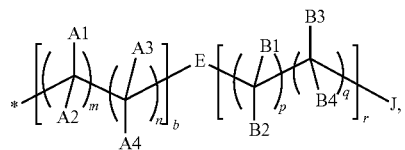

wherein: A1, A2, A3, A4, B1, B2, B3, B4, and J are independently selected from a group including: hydrogen, an alkyl group having a C1~C50 straight or branched chain, a phenyl group, a halogen-modified phenyl group, a halogen, a phenolic hydroxyl group, a carboxyl group, a hydroxyl group, a C3~C6 cycloalkyl group, a C2~C10 straight chain alkene, —NHR", a mercapto group, an amine group, a formyl group, —COOCH3, —SO2NH2, —NHNH2, —CONHNH2, SO3R", a thienyl group, a pyridyl group, a pyrrolyl group, an imidazolyl group, an aniline group, a furyl group, and a carbazole group.

Optionally, R" includes a C1~C20 alkyl group; E is selected from a group including —CH2-, —C=C—, —C≡C—, —COO—, —CONH—, —CO—, —O—, —OCONH—, —NH—, —S—, —COS—, —NHCONH—, —NHCSNH—, NHNH—,

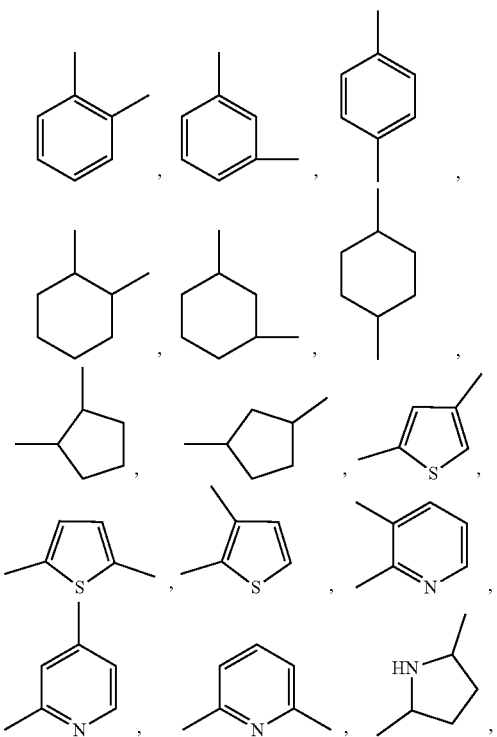

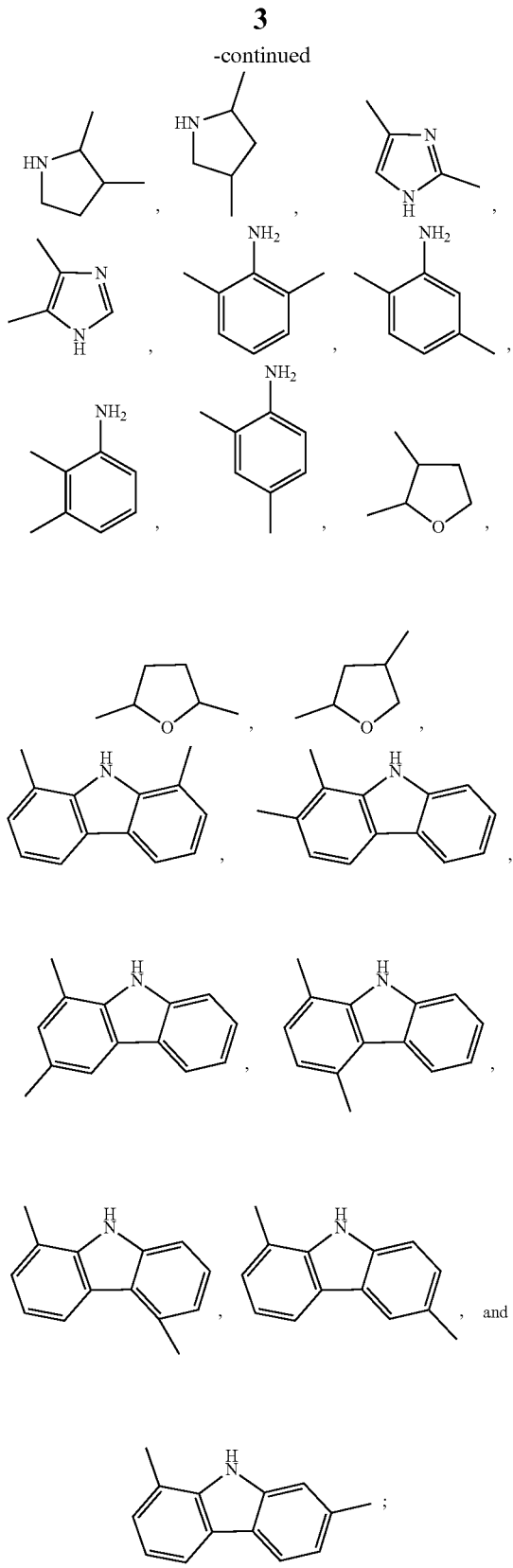

m, n, b, p, q, and r are integers between 0 and approximately 1000000, respectively, and b and r are not 0 at same time.

Optionally, the light-diffusion powder has one or more of a formula (II) and a formula (III):

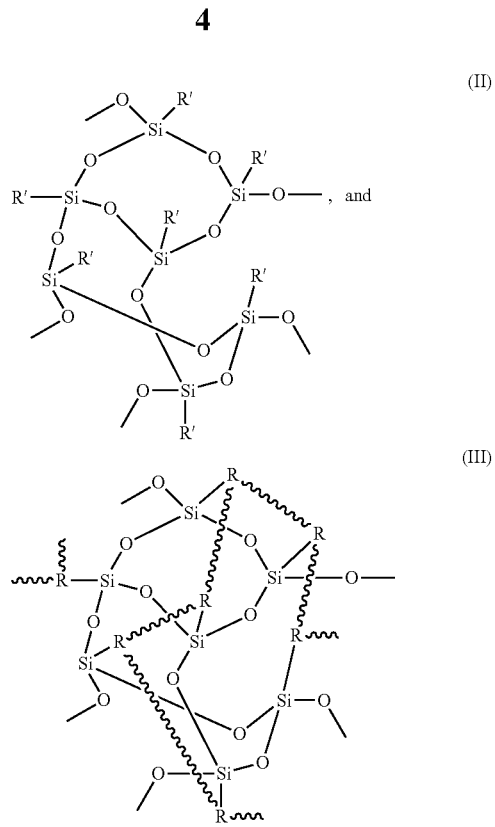

wherein R in formula (III) includes R'.

Optionally, the R' group has an unsaturated bond and forms a polymer chain with a second chemical having an unsaturated bond.

Optionally, the second chemical having an unsaturated bond includes a methacrylate ester, reacting with the alkoxysilane.

Optionally, the alkoxysilane is 3-(triethoxysilyl) propyl methacrylate.

Optionally, the alkoxysilane includes one or more of n-octyl triethoxysilane, n-octadecyl triethoxysilane, (3-glycidoxypropyl) triethoxysilane, benzyl triethoxysilane, and 3-(triethoxysilyl) propyl methacrylate.

Optionally, the light-diffusion powder is prepared in a form of a microsphere having a diameter of approximately 1 nm to 1 μm.

Optionally, the light-diffusion powder is prepared to have a polymeric mesh structure.

Another aspect of the present disclosure provides a quantum-dot-containing photoresist including the disclosed light-diffusion powder, diffused in a photoresist material.

Optionally, the quantum-dot-containing photoresist further includes approximately 0.1% to 50% by weight of the light-diffusion powder of a total of the quantum-dot-containing photoresist.

Optionally, the quantum-dot-containing photoresist further includes quantum dots of approximately 0.05% to 50% by weight; an adhesive of approximately 5% to 45% by weight; a polymerizable monomer of approximately 0.5% to 18% by weight; a photo initiator of approximately 0.1% to 3% by weight; a silane coupling agent of approximately 0.1% to 7% by weight; additional additives of approximately 0.1% to 3% by weight; and a solvent of approximately 40% to 85% by weight.

Optionally, the quantum dot is made of one or more of cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury telluride (HgTe), gallium nitride (GaN), gallium arsenide (GaAs), indium phosphide (InP), and indium arsenide (InAs).

Optionally, the quantum dot is made by at least two materials that are uniformly mixed, gradient mixed, or that form a core-shell structure.

Optionally, the additional additives include at least one of a leveling wetting agent, a defoamer, a UV absorber, and a fixing accelerator.

Optionally, the polymerizable monomer includes an acrylic monomer, including at least one of 1,6-hexanediol diacrylate, dipropylene glycol diacrylate, tripropylene glycol diacrylate, trimethylolpropane triacrylate, ethoxylated yl trimethylol propane triacrylate, pentaerythritol tetraacrylate, tripropylene trimethylolpropane tetraacrylate, and dipentaerythritol pentaacrylate.

Another aspect of the present disclosure provides a quantum-dot-containing color film, including a patterned quantum-dot-containing photoresist layer made of the quantum-dot-containing photoresist according to any one of claims 11-17. The patterned quantum-dot-containing photoresist layer is on a substrate.

Another aspect of the present disclosure provides a method for forming quantum-dot-containing color film by initiating a hydrolysis and condensation reaction of an alkoxysilane to produce light-diffusion powder, the alkoxysilane having a formula (I):

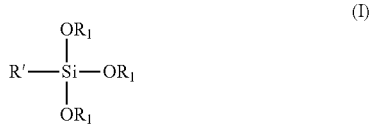

wherein: R1 includes a C1~C50 alkyl group, and R' includes an alkyl, a substituted alkyl group, and a combination thereof.

Optionally, the method further includes: mixing the light-diffusion powder, a photoresist material, and quantum dots to form a mixture; applying the mixture on a substrate to form a quantum-dot-containing photoresist layer; patterning the quantum-dot-containing photoresist layer to form a quantum-dot-containing color film including regions corresponding to pixels on the substrate.

Optionally, the method further includes: a vacuum distillation, after initiating the hydrolysis and condensation reaction of the alkoxysilane.

Optionally, the mixture is formed by: mixing the photoresist material with the quantum dots, followed by adding the light-diffusion powder there-into.

Optionally, the method further includes: selecting at least one of the photoresist material and the light-diffusion powder, such that the photoresist material and the light-diffusion powder have similar chain segment.

Optionally, the light-diffusion powder includes an epoxy structure, and the photoresist material includes an epoxy resin.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
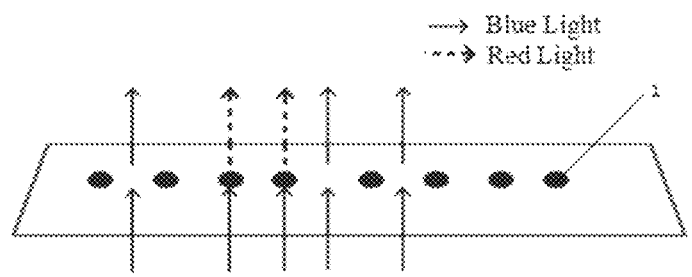
FIG. 1 is a schematic diagram illustrating a conventional quantum-dot-containing color film.

FIG. 1 illustrates a conventional quantum-dot-containing color film. As shown in FIG. 1, the quantum-dot-containing color film includes a plurality of quantum dots 1. An incident portion of blue backlight on the quantum-dot-containing color film may exit the quantum-dot-containing color film, completely missing the quantum dots. This is a waste of blue backlight and causes undesired color mixing. This also reduces red and green light emission efficiency of quantum dots in the quantum-dot-containing color film.

In order to avoid defects of the quantum-dot-containing color film, a light-diffusion powder may be added into a photoresist. The photoresist mixed with the light-diffusion powder and quantum dots may form a quantum-dot-containing color film. Blue backlight enters such quantum-dot-containing color film and refracts back and forth to increase the blue light utilization and to improve the light emission and conversion efficiency of the quantum-dot-containing color film.

Light-diffusion powder may include inorganic light-diffusion powder (for example, silica) and organic light-diffusion powder. Silica light-diffusion powder is difficult to mix uniformly into the photoresist. The resulting quantum-dot-containing color film may not be uniform, may be difficult to form desired patterns, and may have low light conversion efficiency. On the other hand, organic light-diffusion powder has a refractive index similar to photoresist base material, and therefore may not provide an effective light-diffusion function.

The present disclosure provides light-diffusion powder, quantum-dot-containing photoresist containing the disclosed light-diffusion powder, and quantum-dot-containing color film containing the disclosed light-diffusion powder, and methods for making the same.

An exemplary method for preparing light-diffusion powder may include the following exemplary Steps.

In one step, under acidic or basic conditions, an alkoxysilane undergoes hydrolysis and condensation reactions to obtain a light-diffusion powder.

For example, the alkoxysilane may have a chemical structure of formula (I).

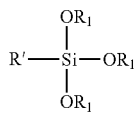

In the chemical structure formula (I), R1 is a C1~C50 alkyl group. Preferably, R1 is a C1~C20 alkyl. In various embodiments, R1 is methyl or ethyl. R' is an alkyl group or a substituted alkyl group. In the substituted alkyl group, the hydrogen in the alkyl chain may be substituted by a halogen, an amino, a hydroxyl, a carboxyl, and/or any other suitable substituent. The substituent may also be a carbon chain segment containing oxygen atom(s), nitrogen atom(s), sulfur atom(s), or any other suitable atoms. For example, the substituent may be an alkoxy group, an epoxy group, an amide group, or an ester group, etc. In one embodiment, R' has a chemical structure formula:

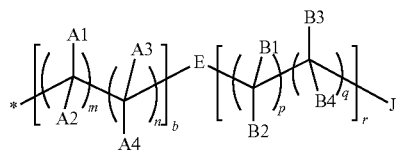

where A1, A2, A3, A4, B1, B2, B3, B4, and J are independently selected from the following groups including: hydrogen, an alkyl group having C1~C50 straight or branched chain, a phenyl group, a halogen-modified phenyl, a halogen, a phenolic hydroxyl group, a carboxyl group, a hydroxyl group, a C3~C6 cycloalkyl group, an epoxy group, a C2~C10 straight chain alkene group, —NHR", a mercapto group, an amine group, a formyl group, —COOCH$_3$, —SO$_2$NH$_2$, —NHNH$_2$, —CONHNH$_2$, a SO$_3$R", a thienyl group, a pyridyl group, a pyrrolyl group, an imidazolyl group, an aniline group, a furyl group, and a carbazole group, where R" is a C1~C20 alkyl group.

In one embodiment, A1, A2, A3, A4, B1, B2, B3, B4, and J are independently selected from the following groups including: hydrogen, an alkyl group having C1~C50 straight or branched chain, a C2~C5 straight chain alkene group, an amine group, a carboxyl group, a phenolic hydroxyl group, a hydroxy group, a chloro, a fluoro, a cyclohexane, a cyclopenxane, and a C3~C6 epoxy group.

In another embodiment A1, A2, A3, and A4 may select to use a same group, and B1, B2, B3, and B4 may select to use a same group. More preferably, A1, A2, A3, A4, B1, B2, B3, and B4 may select to use the same group.

In the chemical structure formula, E is selected from the following groups including: —CH$_2$—, —C=C—, —C≡C—, —COO—, —CONH—, —CO—, —O—, —OCONH—, —NH—, —S—, —COS—, —NHCONH—, —NHCSNH—, NHNH—,

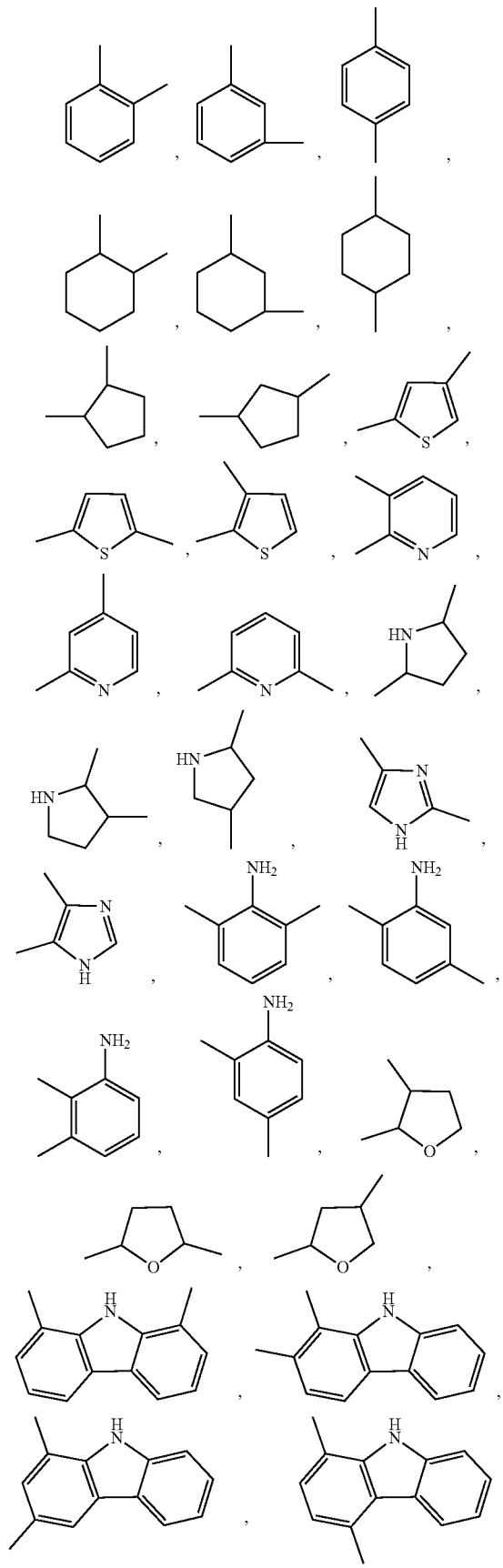

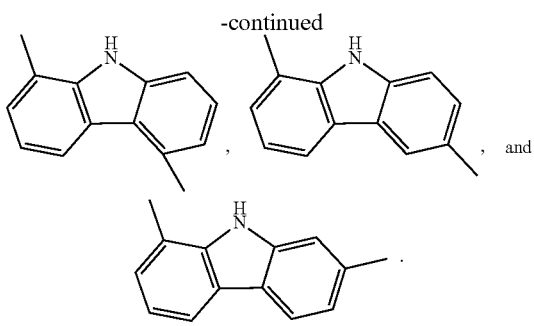

Preferably, E is selected from the following groups including: —CH$_2$—, —C=C—, —C≡C—, —COO—, —CONH—, —CO—, —O—, —OCONH—,

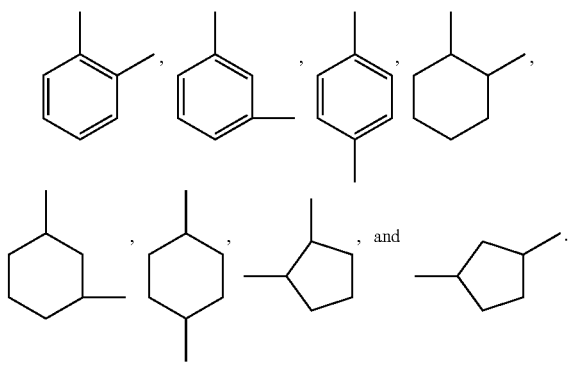

In the chemical structure formula above, m, n, b, p, q, and r may be integers between 0 and approximately 1000000, respectively; and b and r cannot be 0 at the same time. Preferably, m, n, b, p, q, and r may be integers between 0 and approximately 100, respectively. More preferably, m, n, b, p, q, and r may be integers between 1 and approximately 30, respectively. More preferably, m, n, b, p, q, and r may be integers between 1 and approximately 20, respectively. Preferably, R' may be a C2~C30 alkyl group,

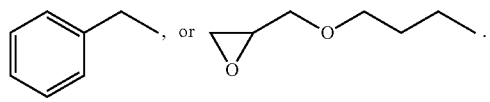

Preferably, the alkoxysilane may be selected from n-octyl triethoxysilane, n-octadecyl triethoxysilane, (3-glycidoxypropyl) triethoxysilane, benzyl triethoxysilane, methacryloxy propyl triethoxysilane, and a combination thereof.

The disclosed method for preparing the light-diffusion powder may further includes the following exemplary steps.

The alkoxysilane is dissolved into an organic solvent, followed by adding an acid or alkali solution therein to perform a heating reaction to produce a reaction product. Under a reduced-pressure or a vacuum, the reaction product may be distilled to obtain a solidified product. The solidified product is then washed sequentially to obtain the light-diffusion powder.

As disclosed, the organic solvent may be a soluble alkyl siloxane, such as acetonitrile or a mixed solution containing tetrahydrofuran and cyclopentanone. Preferably, the acid solution may be a hydrochloric acid solution, with a concentration of approximately 0.01 mol/L to 1 mol/L. Preferably, the alkaline solution may be a sodium hydroxide or potassium hydroxide solution, with a concentration of approximately 0.01 mol/L to 1 mol/L. Preferably, the heating reaction of the mixed solution having the added acid or alkali solution may have a temperature of approximately 80° C. to 100° C. and a reaction time of approximately 8 hours to 20 hours. After the heating reaction is completed, the mixed solution may be cured or otherwise solidified by vacuum distillation for approximately 2 hours to 10 hours to obtain a solidified product.

The solidified product may be washed sequentially to obtain the light-diffusion powder. The light-diffusion powder may have a chemical structure corresponding to the chemical structure formula (II). Preferably, the washing cycle may include a sequence of washing by an acid or alkali solution, distilled water, and an organic solvent. After the washing cycle is completed, the solidified product may be vacuum dried.

In other embodiments, the method for preparing light-diffusion powder may include the following exemplary Steps.

Before undergoing the hydrolysis and condensation reactions, the R' group of the alkyl siloxane is modified.

For example, the modification method may include reacting alkoxysilane with an organic material with unsaturated bond. The R' group may have unsaturated bond. After the R' group reacts with the organic material with unsaturated bond, the unsaturated bond in the R' group may break and reconnect to form a polymer chain. After the modification, R' group may turn into R group. The R groups may be connected by the polymer chain.

The R group may be an alkylene group or a substituted alkylene group. The substituted alkylene group may have halogen, amino, hydroxyl, or carboxyl, etc. to substitute hydrogen in the alkylene chain. The substituent may also be a carbon chain segment containing oxygen, nitrogen, sulfur, and any other suitable atoms. For example, the substituent may be an alkoxy group, an epoxy group, an amide group, and an ester group, etc. In one embodiment, methacrylate ester may be used to modify 3-(triethoxysilyl) propyl methacrylate (also named as methacryloxypropyltriethoxysilane). The double-bond in methacrylate may form a polymeric chain structure with the double-bond of 3-(triethoxysilyl) propyl methacrylate.

Preferably, after the R' group of alkoxysilane (or alkyl siloxane) is modified, the alkyl siloxane may be dissolved in an organic solvent. The organic solvent may be any solvent capable of dissolving the alkyl siloxane, and may include, for example, acetonitrile or a mixed solution containing tetrahydrofuran and cyclopentanone. Then, the alkoxysilane having modified R' group may undergo hydrolysis and condensation reactions under acidic or basic conditions.

Preferably, the acid solution may be a hydrochloric acid solution, with a concentration of approximately 0.01 mol/L to 1 mol/L. Preferably, the alkaline solution may be a sodium hydroxide or potassium hydroxide solution, with a concentration of approximately 0.01 mol/L to 1 mol/L. Preferably, the heating reaction of the mixed solution with the added acid or alkali solution may have a temperature of approximately 20° C. to 100° C. and a reaction time of approximately 8 hours to 30 hours. After the heating reaction is completed, the mixed solution may be aged for approximately 3 days to 10 days to obtain a solid product.

The solid product may be washed sequentially to obtain the light-diffusion powder. The light-diffusion powder may have a chemical structure corresponding to the chemical structure formula (III). Preferably, the washing cycle may include a sequence of washing using an acid or alkali solution, distilled water, and an organic solvent. After the washing cycle is completed, the solidified product or solid product may be vacuum dried.

The light-diffusion powder produced according to the preparation method of the present disclosure may be microspheres having a composite structure. The microspheres may have a diameter between approximately 1 nm and 1 μm. Preferably, the microspheres may have a diameter between approximately 10 nm and 500 nm.

The present disclosure also provides light-diffusion powder, having a chemical structure of formula (II) or (III). The chemical structures shown in the formula (II) and formula (III) are polymeric mesh structures, where the oxygen atoms and the silicon atoms form silicon-oxygen bonds, which may be cross-linked with one another to form a mesh network. All of the R groups in the structure shown in the formula (III) may be interconnected to form a polymeric chain.

The light-diffusion powder according to the present disclosure may have a chemical structure of formula (II).

alkene group, —NHR", a mercapto group, an amine group, a formyl group, —COOCH$_3$, —SO$_2$NH$_2$, —NHNH$_2$, —CONHNH$_2$, SO$_3$R", a thienyl group, a pyridyl group, an imidazolyl group, an aniline group, a furyl group, and a carbazole group, where R" is a C1~C20 alkyl group.

Preferably, A1, A2, A3, A4, B1, B2, B3, B4, and J are independently selected from the following groups including: hydrogen, an alkyl group having a C1~C50 straight or branched chain, a C2~C5 straight chain alkene group, an amine group, a carboxyl group, a phenolic hydroxyl group, a hydroxy group, a chloro, a fluoro, a cyclohexane, a cyclopenxane, and a C3~C6 epoxy group.

Preferably, A1, A2, A3, and A4 may be selected to use the same group, and B1, B2, B3, and B4 may be selected to use the same group. More preferably, A1, A2, A3, A4, B1, B2, B3, and B4 may be selected to use the same group.

In the chemical structure formula above, E is selected from the following groups including: —CH$_2$—, —C=C—, —C≡C—, —COO—, —CONH—, —CO—, —O—, —OCONH—, —NH—, —S—, —COS—, —NHCONH—, —NHCSNH—, NHNH—,

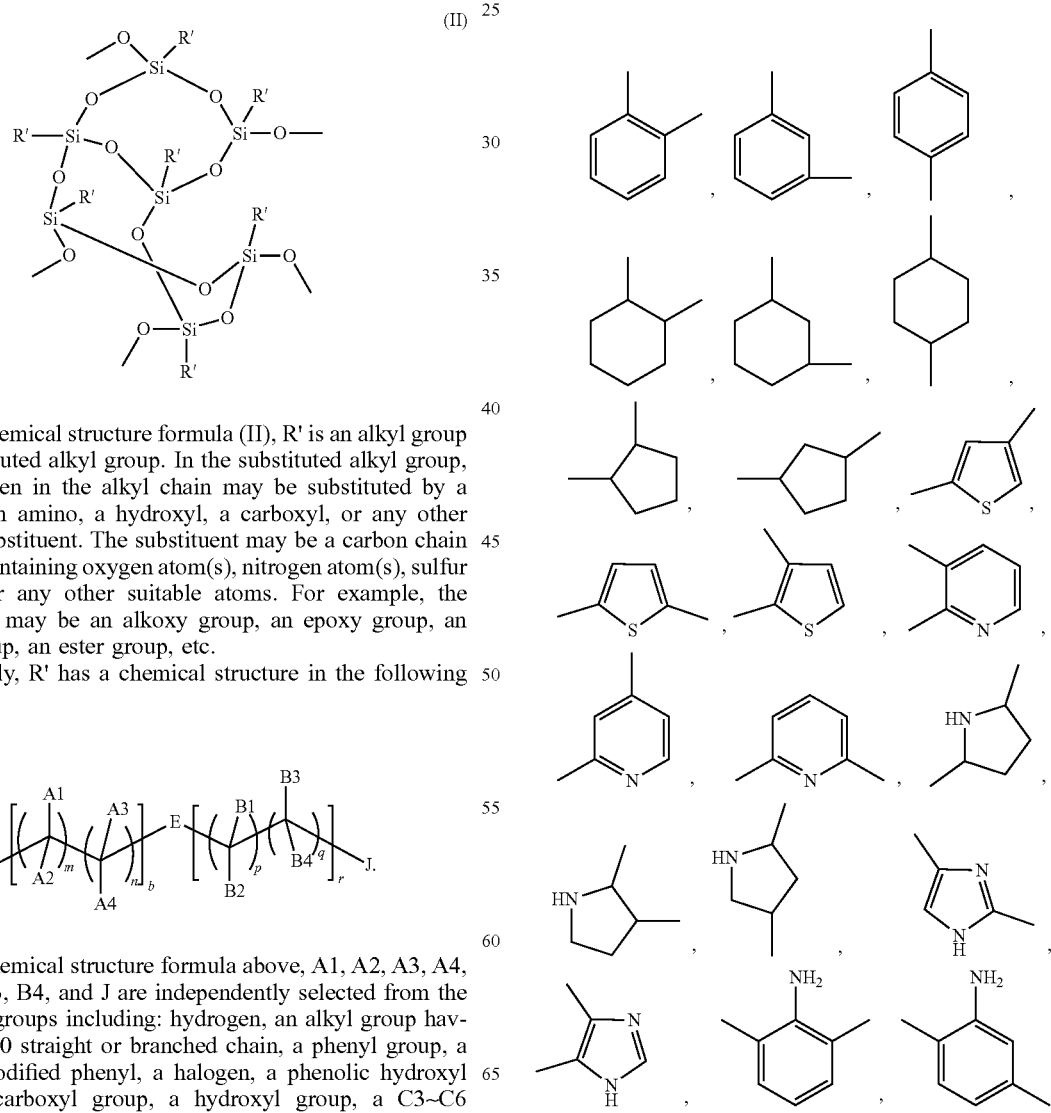

In the chemical structure formula (II), R' is an alkyl group or a substituted alkyl group. In the substituted alkyl group, the hydrogen in the alkyl chain may be substituted by a halogen, an amino, a hydroxyl, a carboxyl, or any other suitable substituent. The substituent may be a carbon chain segment containing oxygen atom(s), nitrogen atom(s), sulfur atom(s), or any other suitable atoms. For example, the substituent may be an alkoxy group, an epoxy group, an amide group, an ester group, etc.

Preferably, R' has a chemical structure in the following formula:

In the chemical structure formula above, A1, A2, A3, A4, B1, B2, B3, B4, and J are independently selected from the following groups including: hydrogen, an alkyl group having C1~C50 straight or branched chain, a phenyl group, a halogen-modified phenyl, a halogen, a phenolic hydroxyl group, a carboxyl group, a hydroxyl group, a C3~C6 cycloalkyl group, an epoxy group, a C2~C10 straight chain

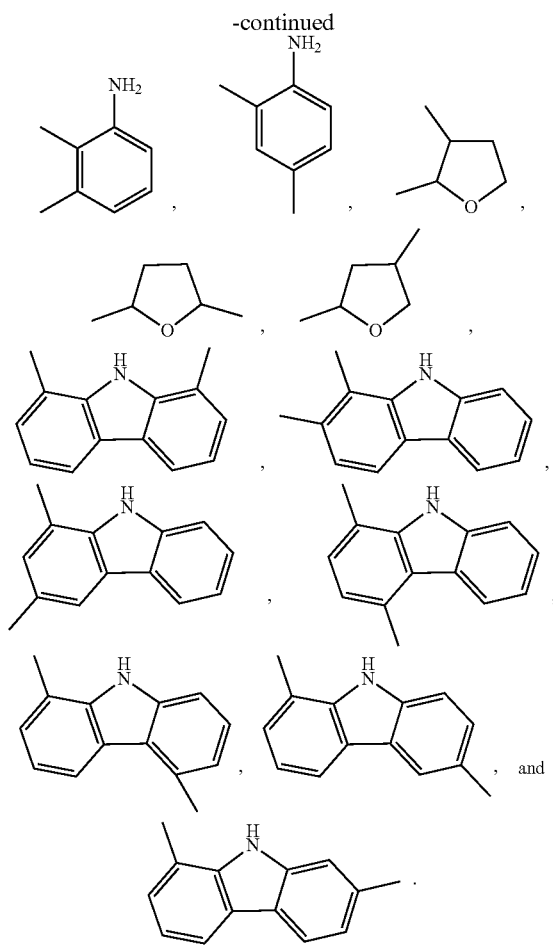

Preferably, E is selected from the following groups including: —CH$_2$—, —C=C—, —C≡C—, —COO—, —CONH—, —CO—, —O—, —OCONH—,

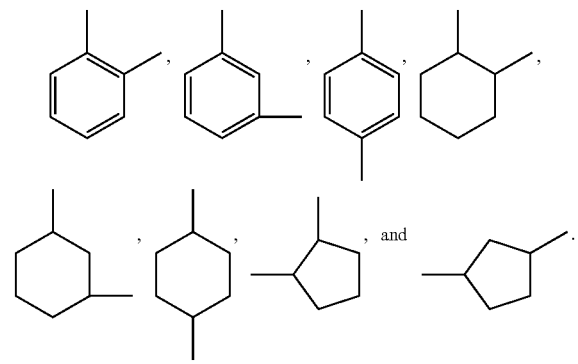

In the chemical structure formula, above, m, n, b, p, q, and r may be integers between 0 and approximately 1000000, respectively; and b and r cannot be 0 at the same time. Preferably, m, n, b, p, q, and r may be integers between 0 and approximately 100, respectively. More preferably, m, n, b, p, q, and r may be integers between 1 and approximately 30, respectively. More preferably, m, n, b, p, q, and r may be integers between 1 and approximately 20, respectively. Preferably, R' may be a C2~C30 alkyl group,

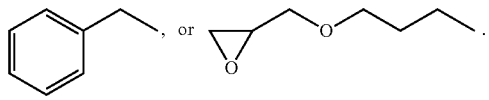

The light-diffusion powder according to the present disclosure may have a chemical structure of formula (III).

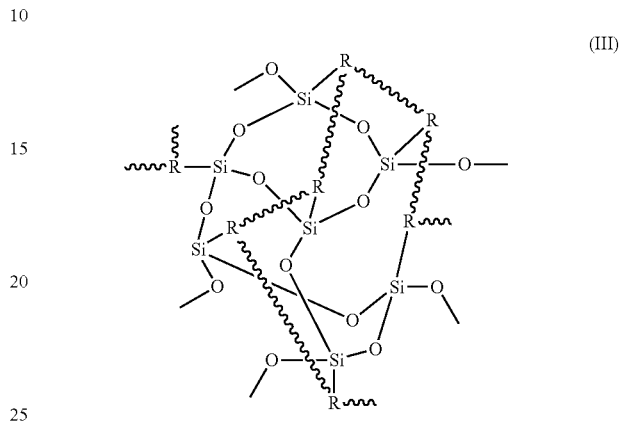

(III)

In the chemical structure formula (III), R is an alkylene group or a substituted alkylene group. In the substituted alkylene group, the hydrogen in the alkylene chain may be substituted by a halogen, an amino, a hydroxyl, a carboxyl, or any other suitable substituent. The substituent may be a carbon chain segment containing oxygen atom(s), nitrogen atom(s), sulfur atom(s), or any other suitable atoms, and may include, for example, an alkoxy group, an epoxy group, an amide group, an ester group, etc.

Preferably, R has a chemical structure including the following formula:

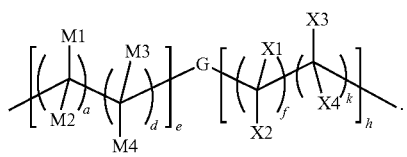

In the chemical structure formula above, M1, M2, M3, M4, X1, X2, X3, and X4 are independently selected from the following groups including: hydrogen, an alkyl group having a C1~C50 straight or branched chain, a phenyl group, a halogen-modified phenyl, a halogen, a phenolic hydroxyl group, a carboxyl group, a hydroxyl group, a C3~C6 cycloalkyl group, a C2~C10 straight chain alkene group, —NHR", a mercapto group, an amine group, a formyl group, —COOCH$_3$, —SO$_2$NH$_2$, —NHNH$_2$, —CONHNH$_2$, a SO$_3$R", a thienyl group, a pyridyl group, an imidazolyl group, an aniline group, a furyl group, and a carbazole group, where R" is a C1~C20 alkyl group.

Preferably, M1, M2, M3, M4, X1, X2, X3, and X4 are independently selected from the following groups including: hydrogen, a C1~C50 straight or branched chain alkyl group, a C2~C5 straight chain alkene group, an amine group, a carboxyl group, a phenolic hydroxyl group, a hydroxy group, a chloro, a fluoro, a cyclohexane, a cyclopenxane, and a C3~C6 epoxy group.

Preferably, M1, M2, M3, and M4 may be selected to use the same group, and X1, X2, X3, and X4 may be selected to use the same group. More preferably, M1, M2, M3, M4, X1, X2, X3, and X4 may be selected to use the same group.

In the chemical structure formula above, G is selected from the following groups including: —CH₂—, —C=C—, —C≡C—, —COO—, —CONH—, —CO—, —O—, —OCONH—, —NH—, —S—, —COS—, —NHCONH—, —NHCSNH—, NHNH—,

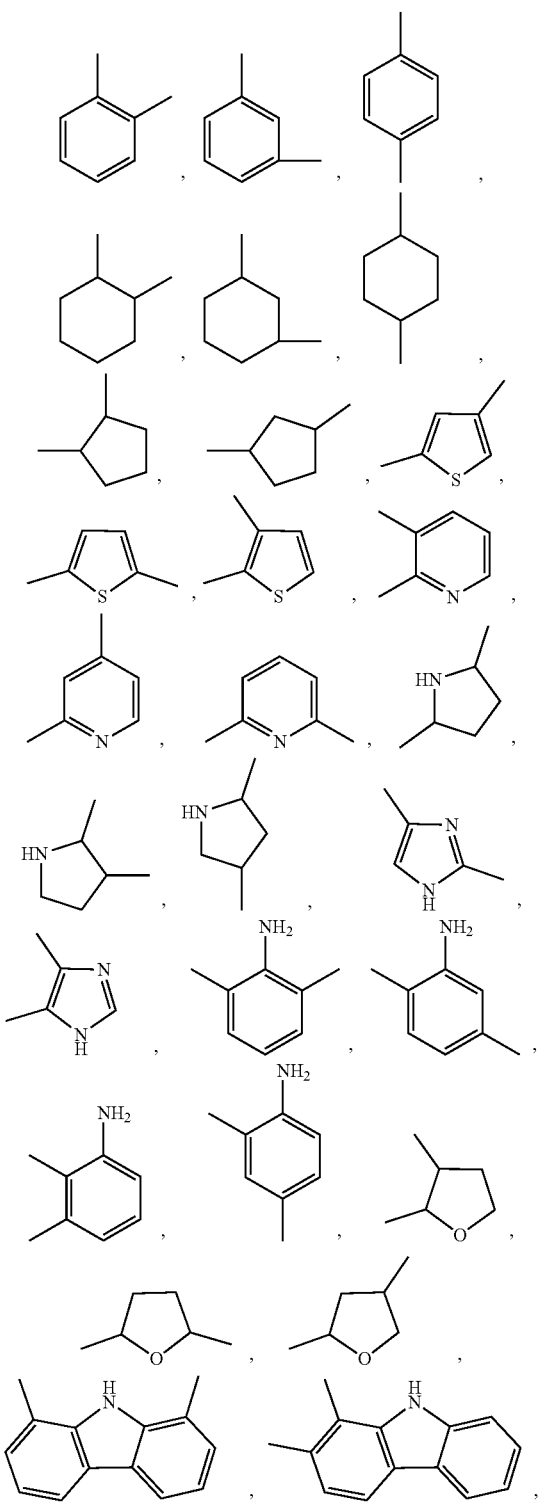

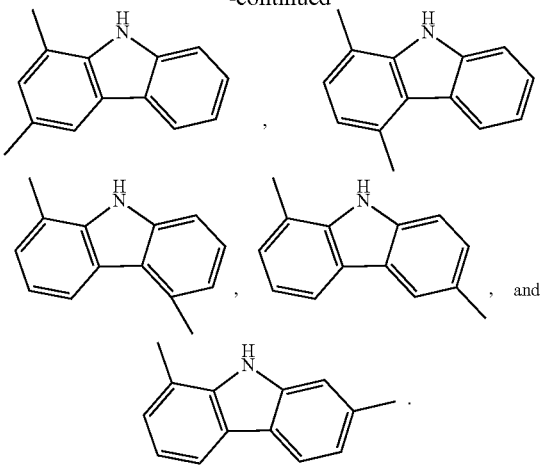

Preferably, E is selected from the following groups including: —CH₂—, —C=C—, —C≡C—, —COO—, —CONH—, —CO—, —O—, —OCONH—,

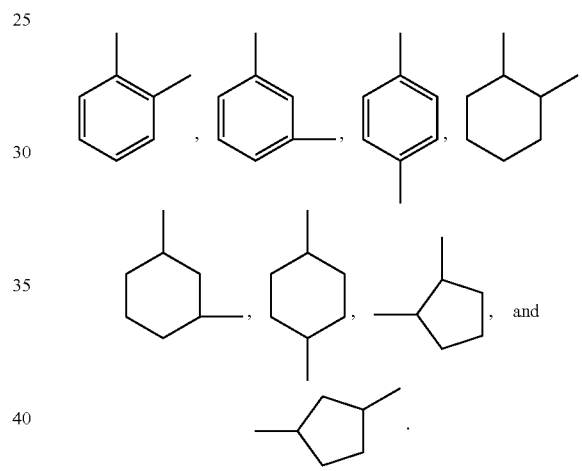

In the chemical structure formula above, a, d, e, f, k, and h may be integers between 0 and approximately 1000000, respectively; and e and h cannot be 0 at the same time. Preferably, a, d, e, f, k, and h may be integers between 0 and approximately 100, respectively. More preferably, a, d, e, f, k, and h may be integers between 1 and approximately 30, respectively. More preferably, a, d, e, f, k, and h may be integers between 1 and approximately 20, respectively.

A connection between R groups may include a chemical structure having chemical structure formula (IV).

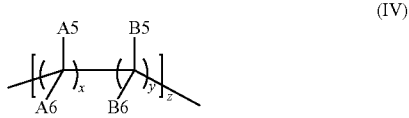

(IV)

In the chemical structure formula (IV), A5, A6, B5, and B6 are independently selected from the following groups including: hydrogen, an alkyl group having a C1~C50 straight or branched chain, a phenyl group, a halogen-modified phenyl, a halogen, a phenolic hydroxyl group, a carboxyl group, a hydroxyl group, a C3~C6 cycloalkyl group, a C2~C10 straight chain alkene group, —NHR", a mercapto group, an amine group, a formyl group, —COOCH$_3$, —SO$_2$NH$_2$, —NHNH$_2$, —CONHNH$_2$, a SO$_3$R", a thienyl group, a pyridyl group, an imidazolyl group, an aniline group, a furyl group, and a carbazole group, where R" is a C1~C20 alkyl group.

Preferably, A5, A6, B5, and B6 are independently selected from the following groups including: hydrogen, a C1~C50 straight or branched chain alkyl group, a C2~C5 straight chain alkene group, an amine group, a carboxyl group, a phenolic hydroxyl group, a hydroxy group, a chloro, a fluoro, a cyclohexane, a cyclopenxane, a C3~C6 epoxy group, and a —COOCH$_3$.

A5, A6, B5, and B6 may be selected to use different groups or use the same group. Preferably, A5, A6, B5, and B6 may be selected to use the same group.

In the chemical structure formula above, x, y, and z may be integers between 0 and approximately 1000000, respectively. Preferably, x, y, and z may be integers between 1 and approximately 1000, respectively. More preferably, x, y, and z may be integers between 1 and approximately 100, respectively. More preferably, x, y, and z may be integers between 1 and approximately 20, respectively. When x, y, and z are all equal to 0, a carbon-carbon single bond may connect between R groups.

In one embodiment, the connection between R groups may have a chemical structure formula as follows:

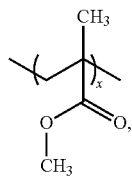

where x is an integer, and 1≤x≤1000000. Preferably, 1≤x≤1000. More preferably, 1≤x≤100. In this case, y in the chemical structure formula (IV) is equal to 0, and z in the chemical structure formula (IV) is equal to 1.

The preparation method according to the present disclosure adjusts the properties of the light-diffusion powder including, for example, solubility, glass transition, and refractive index, etc. by changing the chemical structure of the R' group. When the chemical structure of the R' or R group has sufficient hydrophilic groups, such as —OH, —COOH, —NHR", —NHNH$_2$, —CONHNH$_2$, SO$_3$R", etc., the light-diffusion powder may be more hydrophilic. When the chemical structure of the R' or R group has sufficient hydrophobic groups, the light-diffusion powder may be more lipophilic and more soluble in organic solvent. When the chemical structure of the R' or R group has sufficient heterocyclic groups, such as thiophene, pyridine, pyrrole, imidazole, aniline, furan, carbazole, etc., the light-diffusion powder may have a higher glass transition temperature. When the chemical structure of the R' or R group contains fluorine, the fluorine content may affect the optical properties of the light-diffusion powder.

Figure 2:
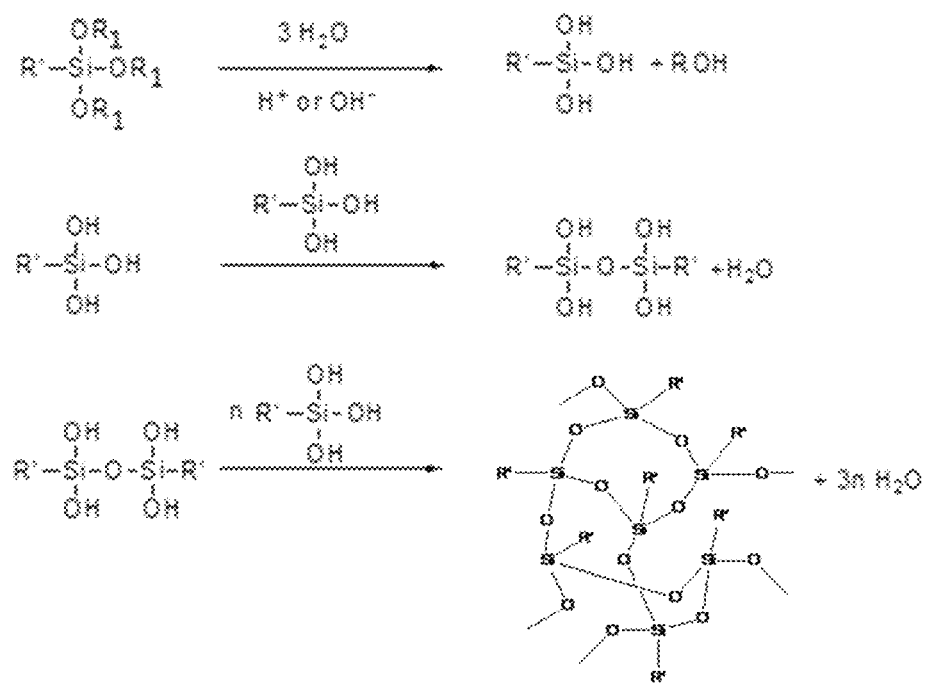
FIG. 2 illustrates an exemplary method for preparing an exemplary light-diffusion powder according to various disclosed embodiments.

FIG. 2 illustrates an exemplary preparation method for an exemplary light-diffusion powder according to various embodiments of the present disclosure. As shown in FIG. 2, the alkoxysilane having a chemical structure of formula (I) may undergo a hydrolysis reaction and a condensation reaction to form a light-diffusion powder having a chemical structure of formula (II). The chemical structure of the light-diffusion power is a polymeric mesh structure, where the oxygen atoms and the silicon atoms form silicon-oxygen bonds crosslinked with one another to form a mesh network.

The present disclosure also provides a quantum-dot-containing photoresist. The quantum-dot-containing photoresist includes the light-diffusion powder produced by the disclosed methods. The quantum-dot-containing photoresist may be a negative photoresist or a positive photoresist. Preferably, the quantum-dot-containing photoresist is a negative photoresist.

Preferably, the quantum-dot-containing photoresist includes approximately 0.1% to 50% by weight of the light-diffusion powder. More preferably, the quantum-dot-containing photoresist includes approximately 3% to 25% by weight of the light-diffusion powder. The quantum-dot-containing photoresist may be obtained by adding the light-diffusion powder into commercially available quantum-dot-containing photoresist that does not contain any color pigment. Alternatively, the quantum-dot-containing photoresist may be obtained by adding quantum dots and the light-diffusion powder into commercially available photoresist that does not contain any quantum dots or color pigment. Preferably, the light-diffusion powder may be uniformly distributed over the quantum-dot-containing photoresist so that the resulted quantum-dot-containing photoresist has a uniform performance.

Preferably, the quantum-dot-containing photoresist may further include approximately 0.05% to 50% by weight of quantum dots, approximately 5% to 45% by weight of adhesive, approximately 0.5% to 18% by weight of a polymerizable monomer, approximately 0.1% to 3% by weight of photo initiator, approximately 0.1% to 7% by weight of silane coupling agent, approximately 0.1% to 1% by weight of other additives, and approximately 40% to 85% by weight of solvent.

For example, the quantum dots may be formed of one or more of cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury telluride (HgTe), gallium nitride (GaN), gallium arsenide (GaAs), indium phosphide (InP), indium arsenide (InAs), and a combination thereof. Various quantum dots may be combined or mixed including, for example, a uniformly mixed type, a gradient mixed type, a core-shell mixed type, or a union mixed type.

The adhesive may be an acrylic resin, a copolymer and derived compound of an unsaturated acid anhydride or unsaturated carboxylic acids with styrene, an unsaturated polyester, an epoxy acrylate, an urethane acrylate, a polyester acrylate, a polyether acrylate, a monofunctional monomer, and a polyfunctional monomer. For example, the monomer may be dipentaerythritol pentaacrylate (DPHA), dipentaerythritol hexaacrylate, dipropylene glycol diacrylate, tripropylene glycol diacrylate, trimethylol propane tri acrylate (TMPTA), tripropylene trimethylolpropane tetraacrylate, aliphatic urethane acrylate, or epoxy resin. In one embodiment, adhesive is an acrylic resin.

The polymerizable monomer may be an acrylic monomer, for example, including at least one of a 1,6-hexanediol diacrylate, a dipropylene glycol diacrylate, a tripropylene glycol diacrylate, a trimethylolpropane triacrylate, an ethoxylated yl trimethylol propane triacrylate, a pentaerythritol tetraacrylate, a tripropylene trimethylolpropane tetraacrylate, and a dipentaerythritol pentaacrylate.

The photo initiator may include at least one of a diimidazole compound, a benzoin-based compound, a polynuclear quinone compound, a benzophenone compound, an acetophenone compound, a triazine compound, a diazo compound, an anthracene-based compound, a cushions xanthones compound, an oxime ester compound, an iodonium salt, and a sulfonium salt.

The other additives may include at least one of a leveling wetting agent, a defoamer, a UV absorber, and a fixing accelerator.

The solvent may be an alcohol, an ethylene glycol monomethyl ether, an ethylene glycol monomethyl ether, a propylene glycol monomethyl ether, an ethylene glycol monomethyl ether, a diethylene glycol diethyl ether ethyl acetate, a methyl ethyl ketone, a methyl isobutyl butyl ketone, an ethylene glycol monomethyl ether acetate, a γ-butyrolactone, a propionic-3-ether acetate, a butyl carbitol, a butyl carbitol acetate, a propylene glycol monomethyl ether, a propylene glycol monomethyl methyl ether acetate, a cyclohexane, a xylene, and an isopropanol. Preferably, the solvent may be at least one of a propylene glycol monomethyl ether, a propylene glycol monomethyl ether acetate, an cyclohexane, a butyl carbitol, a butyl carbitol acetate, and a γ-butyrolactone.

Figure 3:
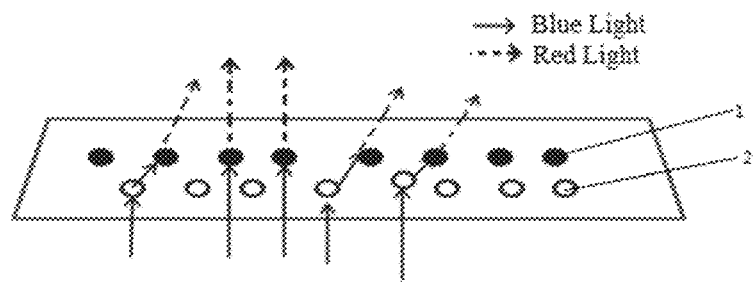
FIG. 3 is a schematic diagram illustrating an exemplary quantum-dot-containing color film according to various disclosed embodiments.

FIG. 3 is a schematic diagram illustrating an exemplary quantum-dot-containing color film according to the present disclosure. As shown in FIG. 3, the quantum-dot-containing color film includes a plurality of quantum dots 1 and a light-diffusion powder 2. The quantum-dot-containing color film is formed by adding the disclosed light-diffusion powder into the quantum-dot-containing photoresist. When an incident blue light is irradiated on the light-diffusion powder, the blue light is refracted or transmitted onto red quantum dots or green quantum dots in the quantum-dot-containing color film. Compared to the quantum-dot-containing color film made of the quantum-dot-containing photoresist without the added light-diffusion powder, the blue light may hit more red and green quantum dots in the quantum-dot-containing color film with the added light-diffusion powder. Thus, the intensity of light excited by the red and green quantum dots may increase to improve the efficiency of light emission and light conversion.

The present disclosure also provides a quantum-dot-containing color film. The quantum-dot-containing color film is made of the quantum-dot-containing photoresist according to the present disclosure. That is, the quantum-dot-containing photoresist is coated on a substrate, and then a patterning process is used to form a quantum-dot-containing color film.

For further illustration of the present disclosure, Examples are provided below to describe more details about the light-diffusion powder, the preparation method for the light-diffusion powder, the quantum-dot-containing photoresist, and the quantum-dot-containing color film according to the present disclosure. However, the scope of the present disclosure is not limited by the various disclosed embodiments.

Example 1

N-octyl triethoxysilane of approximately 13.8 mg/0.05 mmol was dissolved in approximately 20 ml of acetonitrile. Then, about 10 ml of hydrochloric acid solution with a concentration of approximately 0.01 mol/L is added. The mixed solution is stirred and heated in an oil bath at a temperature of approximately 90° C. for approximately 12 hours. Then, the stirring is stopped and the mixed solution is cured or solidified under a pressure-reduced heating condition for approximately 5 hours. The solidified product is washed sequentially by a hydrochloric acid solution having a concentration of approximately 1 mol/L, distilled water, and an acetonitrile solution. Finally, the solidified product is washed by an acetone solution. The washed product is dried in a vacuum at a temperature of approximately 60° C. to obtain the light-diffusion powder. The light-diffusion powder has a chemical structure of formula (II), where R'=CH$_3$(CH$_2$)$_6$CH$_2$—.

A plurality of red core-shell type quantum dots made of CdSe/ZnS is dispersed into a massively produced photoresist stock solution that is free of pigments. Then, the light-diffusion powder is added. The mixed liquid is dispersed ultrasonically for approximately one hour. The resulting liquid has a mixing ratio of approximately 10% by weight of quantum dots, approximately 20% by weight of the light-diffusion powder, approximately 20% by weight of acrylic resin, approximately 10% by weight of 1,6-hexanediol diacrylate, approximately 1.5% by weight of benzophenone compound, approximately 3% by weight of silane coupling agent, approximately 0.5% by weight of defoamer, and approximately 35% by weight of ethylene glycol monomethyl ether. Then, the mixed liquid is coated on a substrate. A patterning process is used to form the quantum-dot-containing color film.

The n-octyl triethoxysilane has a chemical structure of:

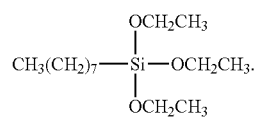

Example 2

Approximately 20.9 mg/0.05 mmol of n-octadecyl triethoxysilane is dissolved in approximately 20 ml of acetonitrile. Then, about 10 ml of hydrochloric acid solution with a concentration of approximately 0.01 mol/L is added. The mixed solution is stirred and heated in an oil bath at a temperature of approximately 90° C. for approximately 12 hours. Then, the stirring is stopped and the mixed solution is cured or solidified under a pressure-reduced heating condition for approximately 3 hours. The solidified product is washed sequentially by a hydrochloric acid solution having an approximate 1 mol/L concentration, distilled water, and an acetonitrile solution. Finally, the solidified product is washed by an acetone solution. The washed product is dried in a vacuum at a temperature of approximately 60° C. to obtain the light-diffusion powder. The light-diffusion powder has a chemical structure of formula (II), where R'=CH$_3$(CH$_2$)$_6$CH$_2$—.

A plurality of red core-shell type quantum dots made of CdSe/ZnS is dispersed into a massively produced photoresist liquid or stock solution, that is free of pigments. Then, the light-diffusion powder is added. The mixed liquid is dispersed ultrasonically for approximately one hour. The resulting liquid has a mixing ratio of approximately 10% by weight of quantum dots, approximately 20% by weight of the light-diffusion powder, approximately 20% by weight of acrylic resin, approximately 10% by weight of 1,6-hexanediol diacrylate, approximately 1.5% by weight of benzophenone compound, approximately 3% by weight of silane coupling agent, approximately 0.5% by weight of defoamer, and approximately 35% by weight of ethylene glycol monomethyl ether. Then, the mixed liquid is coated on a substrate. A patterning process is used to form the quantum-dot-containing color film.

The n-octyl triethoxysilane has a chemical structure of:

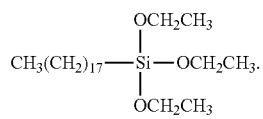

Example 3

Approximately 14.1 mg/0.05 mmol of (3-glycidoxypropyl) triethoxysilane is dissolved in approximately 20 ml of acetonitrile. Then, 10 ml of hydrochloric acid solution with a concentration of approximately 0.01 mol/L is added. The mixed solution is stirred and heated in an oil bath at a temperature of approximately 90° C. for approximately 12 hours. Then, the stirring is stopped and the mixed solution is cured under a pressure-reduced heating condition for approximately 2 hours. The solidified product is washed sequentially by a hydrochloric acid solution having an approximate 1 mol/L concentration, distilled water, and an acetonitrile solution. Finally, the solidified product is washed by an acetone solution. The washed product is dried in a vacuum at a temperature of approximately 60° C. to obtain the light-diffusion powder.

A plurality of red core-shell type quantum dots made of CdSe/ZnS is dispersed into a massively produced photoresist liquid that is free of pigments. Then, the light-diffusion powder is added. The mixed liquid is dispersed ultrasonically for approximately one hour. The resulting liquid has a mixing ratio of approximately 10% by weight of quantum dots, approximately 10% by weight of the light-diffusion powder, approximately 30% by weight of epoxy resin, approximately 10% by weight of 1,6-hexanediol diacrylate, approximately 1.5% by weight of benzophenone compound, approximately 3% by weight of silane coupling agent, approximately 0.5% by weight of defoamer, and approximately 35% by weight of ethylene glycol monomethyl ether. Then, the mixed liquid is coated on a substrate. A patterning process is used to form the quantum-dot-containing color film.

The light-diffusion powder has a chemical structure of formula (II), where R' is:

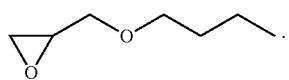

In this case, the light-diffusion powder includes an epoxy structure, similar to the structure of an epoxy resin. When being mixed into an epoxy type photoresist, such light-diffusion powder is more compatible with the epoxy type photoresist.

Example 4

Approximately 12.7 mg/0.05 mmol of (3-glycidoxypropyl) triethoxysilane is dissolved in approximately 20 ml of acetonitrile. Then, 10 ml of hydrochloric acid solution with a concentration of approximately 0.01 mol/L is added. The mixed solution is stirred and heated in an oil bath at a temperature of approximately 90° C. for approximately 12 hours. Then, the stirring is stopped and the mixed solution is cured under a pressure-reduced heating condition for approximately 8 hours. The solidified product is washed sequentially by a hydrochloric acid solution having an approximate 1 mol/L concentration, distilled water, and an acetonitrile solution. Finally, the solidified product is washed by an acetone solution. The washed product is dried in a vacuum at a temperature of approximately 60° C. to obtain the light-diffusion powder.

The light-diffusion powder has a chemical structure of formula (II), where R' is

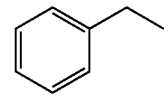

A plurality of red core-shell type quantum dots made of CdSe/ZnS is dispersed into a massively produced photoresist liquid that is free of pigments. Then, the light-diffusion powder is added. The mixed liquid is dispersed ultrasonically for approximately one hour. The resulting liquid has a mixing ratio of approximately 10% by weight of quantum dots, approximately 30% by weight of the light-diffusion powder, approximately 20% by weight of acrylic resin, approximately 10% by weight of 1,6-hexanediol diacrylate, approximately 1.5% by weight of benzophenone compound, approximately 3% by weight of silane coupling agent, approximately 0.5% by weight of defoamer, and approximately 25% by weight of ethylene glycol monomethyl ether. Then, the mixed liquid is coated on a substrate. A patterning process is used to form the quantum-dot-containing color film. The massively produced photoresist is an acrylic resin liquid type negative photoresist.

Example 5

Methyl methacrylate and methacryloxy-propyl triethoxysilane (CAS: 21142-29-0) at an approximate molar ratio of 27:1 are added into a pure anhydrous toluene. An AIBN initiator of approximately 0.2% by weight of a total of reactants is added into the mixture. The mixed solution is placed in a vacuum and then is exposed to nitrogen gas three times at a temperature of approximately −78° C. Then, the mixed solution is heated to a temperature of approximately 65° C. and keeps at this temperature for 24 hours. The mixed solution is cooled down to extract a polymer out of the anhydrous ether. The polymer is extracted by a Soxhlet extractor for 72 hours, where the extraction agent is anhydrous ether.

The mole fraction of the segment

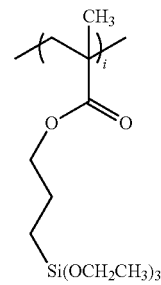

is about 5.3%.

Next, the polymer is dissolved into a cyclopentanone liquid. An amount of hydrochloric acid solution with a concentration of approximately 0.01 mol/L is added. The amount of hydrochloric acid solution has a mole number equal to the mole number for

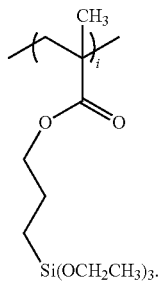

The mixed solution is stirred and heated in an oil bath at a temperature of approximately 50° C. for approximately 1 hour. The mixed solution continues to be stirred at the room temperature overnight. Small molecule sol-gel is aged for approximately 5 days. The mixed solution is filtered by an approximately 0.22 μm thick tetrafluoroethylene membrane, and is dried in a vacuum at the room temperature for approximately 24 hours to obtain the light-diffusion powder. The light-diffusion powder has a chemical structure of formula (III).

A plurality of red core-shell type quantum dots made of CdSe/ZnS is dispersed into a massively produced photoresist liquid that is free of pigments. Then, the light-diffusion powder is added. The mixed liquid is dispersed ultrasonically for approximately one hour. The resulting liquid has a mixing ratio of approximately 10% by weight of quantum dots, approximately 20% by weight of the light-diffusion powder, approximately 20% by weight of acrylic resin, approximately 10% by weight of 1,6-hexanediol diacrylate, approximately 1.5% by weight of benzophenone compound, approximately 3% by weight of silane coupling agent, approximately 0.5% by weight of defoamer, and approximately 35% by weight of ethylene glycol monomethyl ether. Then, the mixed liquid is coated on a substrate. A patterning process is used to form the quantum-dot-containing color film. The massively produced photoresist is an acrylic resin liquid type negative photoresist.

Figure 4:
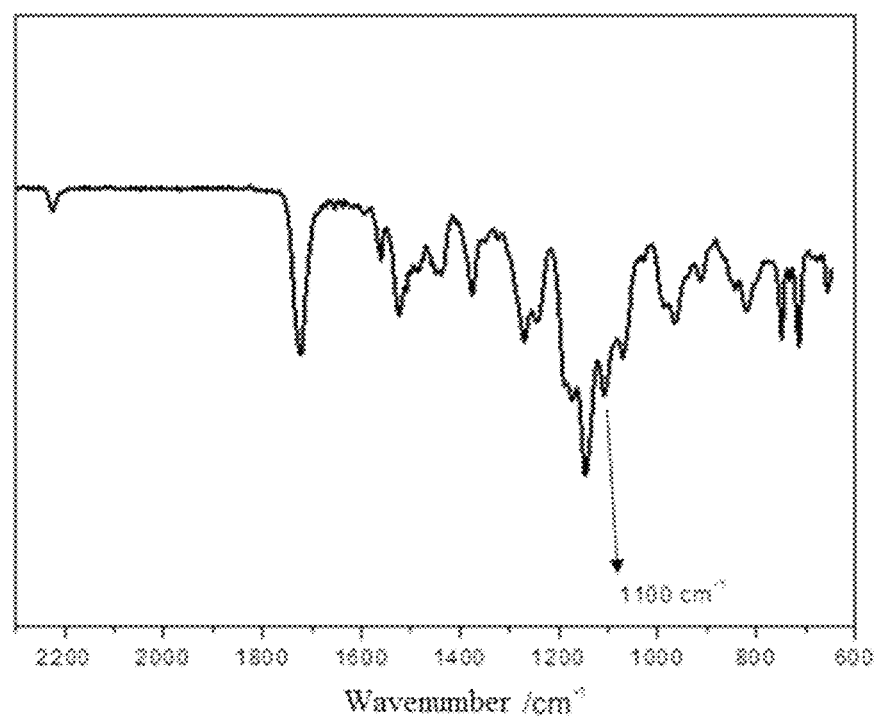
FIG. 4 is an infrared spectrum diagram of an exemplary light-diffusion powder according to various disclosed embodiments.

FIG. 4 is an infrared spectrum diagram of an exemplary light-diffusion powder according to various embodiments of the present disclosure. As shown in FIG. 4, an absorption peak of Si—O—Si appears at around 1100 cm$^{-1}$. The light-diffusion powder has a chemical structure of formula (III).

Figure 5:
FIG. 5 is a scanning electron microscope image of an exemplary quantum-dot-containing photoresist according to various disclosed embodiments.
Figure 6:
FIG. 6 is a scanning electron microscope image of a conventional quantum-dot-containing photoresist.
Figure 7:
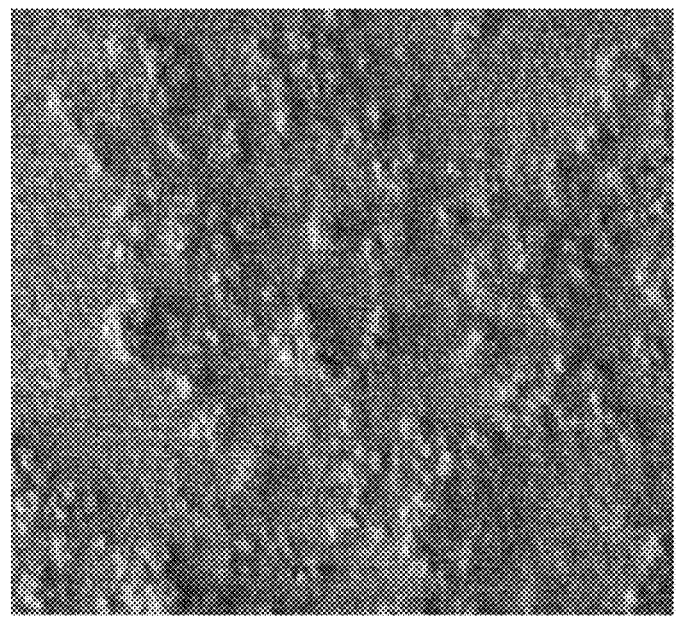
FIG. 7 is a scanning electron microscope image of an exemplary quantum-dot-containing photoresist added with silica light-diffusion powder according to various disclosed embodiments.

FIG. 5 is a scanning electron microscope (SEM) image of an exemplary quantum-dot-containing photoresist according to various embodiments of the present disclosure. FIG. 6 is an SEM image of a conventional quantum-dot-containing photoresist. The conventional quantum-dot-containing photoresist includes quantum dots, an adhesive, a polymerizable monomer, a photo initiator, a silane coupling agent, additives, and a solvent. FIG. 7 is an SEM image of an exemplary quantum-dot-containing photoresist added with silica light-diffusion powder according to the present disclosure. The quantum-dot-containing photoresist added with silica light-diffusion powder includes silica, quantum dots, an adhesive, a polymerizable monomer, a photo initiator, a silane coupling agent, additives, and a solvent. As shown in FIGS. 5-6, in the quantum-dot-containing photoresist, the added light-diffusion powder according to the present disclosure is well-dispersed and agglomeration of the microspheres of the light-diffusion powder is avoided.

Figure 8:
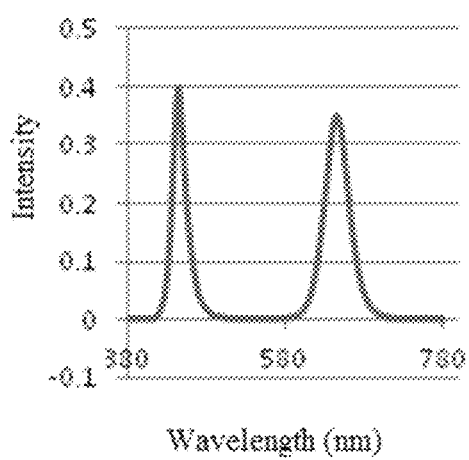
FIG. 8 is an excited light spectrum diagram of an exemplary quantum-dot-containing color film according to various disclosed embodiments.
Figure 9:
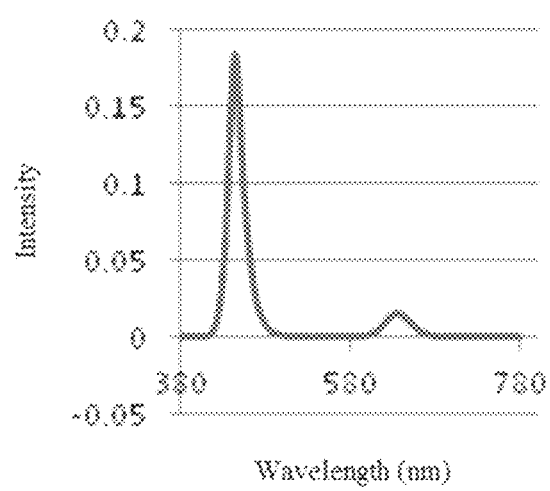
FIG. 9 is an excited light spectrum diagram of a conventional quantum-dot-containing photoresist.

FIG. 8 is an excited light spectrum diagram of an exemplary quantum-dot-containing color film according to various embodiments of the present disclosure. FIG. 9 is an excited light spectrum diagram of a conventional quantum-dot-containing photoresist. Comparing FIG. 8 and FIG. 9, when an incident light passes through the quantum-dot-containing color film according to the present disclosure, the red light emission efficiency increases substantially. In other words, the addition of the disclosed light-diffusion powder improves the light emission efficiency and the emitted light intensity.

Example 6

Methyl methacrylate and methacryloxy-propyl triethoxysilane (CAS: 21142-29-0) at an approximate molar ratio of 9:1 are added into a pure anhydrous toluene. An AIBN initiator of approximately 0.2% by weight of a total of reactants is added into the mixture. The mixed solution is placed in a vacuum and then is exposed to nitrogen gas three times at a temperature of approximately −78° C. Then, the mixed solution is heated to a temperature of approximately 65° C. and keeps at this temperature for 24 hours. The mixed solution is cooled down to extract a polymer out of the anhydrous ether. The polymer is extracted by a Soxhlet extractor for 72 hours, where the extraction agent is anhydrous ether.

The mole fraction of the segment

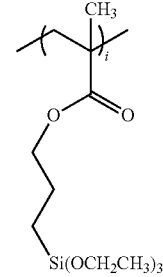

is 2%.

Next, the polymer is dissolved into a mixed solution of tetrahydrofuran and cyclopentanone. The tetrahydrofuran and cyclopentanone has a volume ratio of approximately 1:4. An amount of hydrochloric acid solution with a concentration of approximately 0.01 mol/L is added. The amount of hydrochloric acid solution has a mole number equal to the mole number for

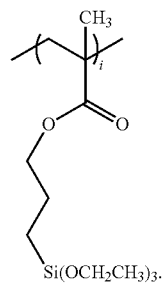

The mixed solution is stirred and heated in an oil bath at a temperature of approximately 50° C. for approximately 1 hour. The mixed solution continues to be stirred at the room temperature overnight. Small molecule sol-gel is aged for approximately 8 days. The mixed solution is filtered by an approximately 0.22 μm thick tetrafluoroethylene membrane, and is dried in a vacuum at the room temperature for approximately 24 hours to obtain the light-diffusion powder.

A plurality of red core-shell type quantum dots made of CdSe/ZnS is dispersed into a massively produced photoresist liquid that is free of pigments. Then, the light-diffusion powder is added. The mixed liquid is dispersed ultrasonically for approximately one hour. The resulting liquid has a mixing ratio of approximately 10% by weight of quantum dots, approximately 20% by weight of the light-diffusion powder, approximately 20% by weight of acrylic resin, approximately 10% by weight of 1,6-hexanediol diacrylate, approximately 1.5% by weight of benzophenone compound, approximately 3% by weight of silane coupling agent, approximately 0.5% by weight of defoamer, and approximately 35% by weight of ethylene glycol monomethyl ether. Then, the mixed liquid is coated on a substrate. A patterning process is used to form the quantum-dot-containing color film. The massively produced photoresist is an acrylic resin liquid type negative photoresist.

In this manner, various embodiments provide a quantum-dot-containing photoresist including the disclosed light-diffusion powder, diffused in a photoresist material. The quantum-dot-containing photoresist further includes approximately 0.1% to 50% by weight of the light-diffusion powder of a total of the quantum-dot-containing photoresist. In addition, the quantum-dot-containing photoresist may include quantum dots of approximately 0.05% to 50% by weight; an adhesive of approximately 5% to 45% by weight; a polymerizable monomer of approximately 0.5% to 18% by weight; a photo initiator of approximately 0.1% to 3% by weight; a silane coupling agent of approximately 0.1% to 7% by weight; additional additives of approximately 0.1% to 3% by weight; and a solvent of approximately 40% to 85% by weight.

Various embodiments also provide a quantum-dot-containing color film. The quantum-dot-containing color film may include a patterned quantum-dot-containing photoresist layer. For example, the quantum-dot-containing photoresist may be applied to a substrate to form a quantum-dot-containing photoresist layer on the substrate. The quantum-dot-containing photoresist layer may then be patterned to form the quantum-dot-containing color film on the substrate.

Various embodiments further provide a method for forming quantum-dot-containing color film. For example, after the hydrolysis and condensation reaction of an alkoxysilane, the light-diffusion powder may be produced. The light-diffusion powder, the photoresist material, and the quantum dots may then form a mixture. The mixture may be formed by: first mixing the photoresist material with the quantum dots, followed by adding the light-diffusion powder thereinto. Alternatively, the mixture may be formed by mixing the photoresist material, the quantum dots, and the light-diffusion powder together at the same time.

The formed mixture may then be applied onto a substrate to form a quantum-dot-containing photoresist layer. The quantum-dot-containing photoresist layer may be patterned to form a quantum-dot-containing color film including regions corresponding to pixels on the substrate.

In various embodiments, the photoresist material and/or the light-diffusion powder may be selected in a manner such that the photoresist material and the light-diffusion powder have similar chain segment. For example, the light-diffusion powder includes an epoxy structure, and the photoresist material includes an epoxy resin.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated.

It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the disclosure.

It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A quantum-dot-containing photoresist comprising a light-diffusion powder diffused in a photoresist material, the light-diffusion powder obtained from an alkoxysilane having a formula (I):

wherein $R_1$ includes a C1~C50 alkyl group, and R' includes an alkyl, a substituted alkyl group, and a combination thereof.

2. The quantum-dot-containing photoresist of claim 1, wherein the R' of the light-diffusion powder has a formula:

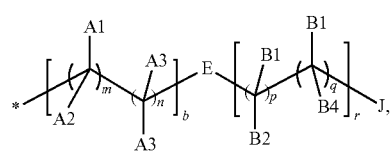

wherein:
A1, A2, A3, A4, B1, B2, B3, B4, and J are independently selected from a group including: hydrogen, an alkyl group having a C1~C50 straight or branched chain, a phenyl group, a halogen-modified phenyl group, a halogen, a phenolic hydroxyl group, a carboxyl group, a hydroxyl group, a C3~C6 cycloalkyl group, a C2~C10 straight chain alkene, —NHR", a mercapto group, an amine group, a formyl group, —COOCH$_3$, —SO$_2$NH$_2$, —NHNH$_2$, —CONHNH$_2$, SO$_3$R", a thienyl group, a pyridyl group, a pyrrolyl group, an imidazolyl group, an aniline group, a furyl group, and a carbazole group, m, n, b, p, q, and r are integers between 0 and approximately 1000000, respectively, and b and r are not 0 at same time, R" includes a C1~C20 alkyl group, and E is selected from a group including: —CH$_2$—, —C=C—, —C≡C—, —COO—, —CONH—, —CO—, —O—, —OCONH—, —NH—, —S—, —COS—, —NHCONH—, —NHCSNH—, NHNH—,

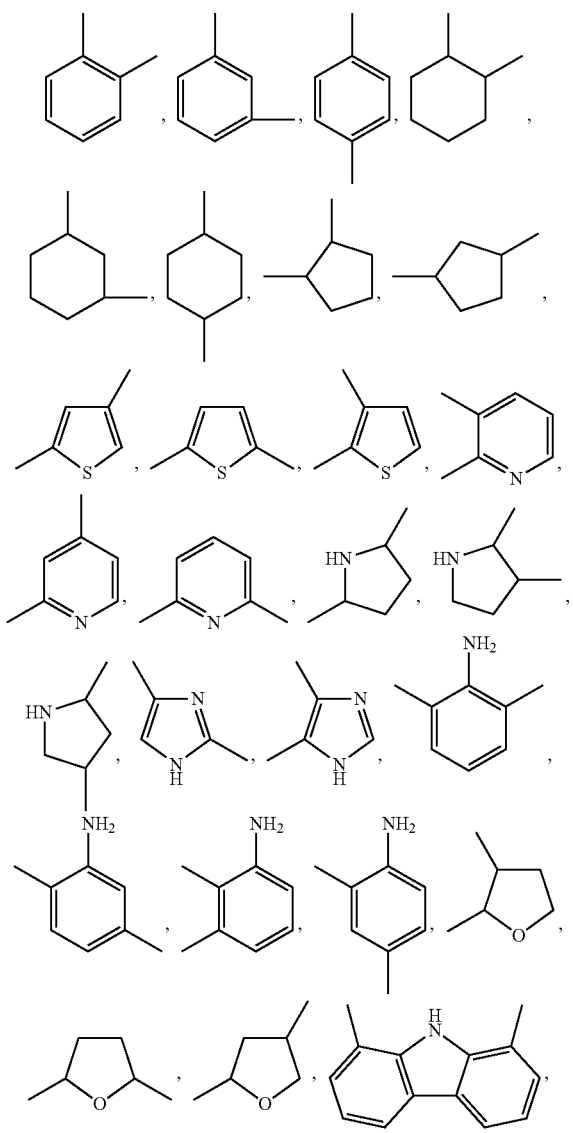

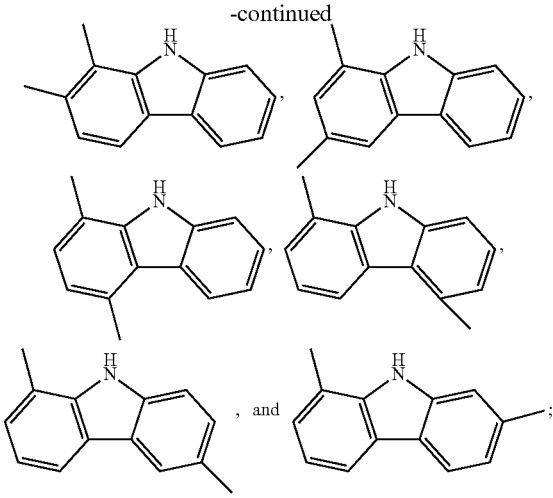

3. The quantum-dot-containing photoresist of claim 1, the light-diffusion powder having one or more of a formula (II) and a formula (III):

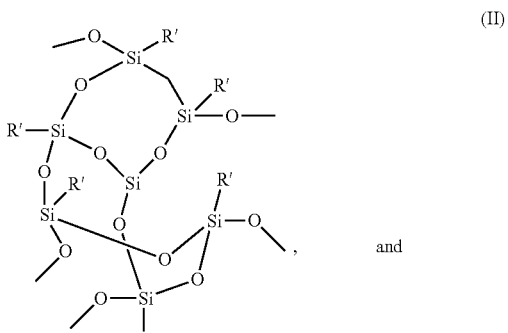

(II)

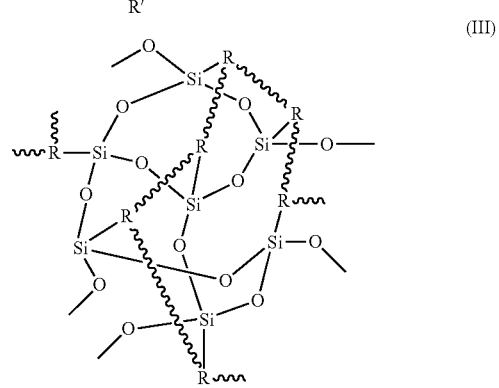

(III)

wherein R in formula (III) includes R'.

4. The quantum-dot-containing photoresist of claim 1, wherein the R' group of the light-diffusion powder has an unsaturated bond and forms a polymer chain with a second chemical having an unsaturated bond.

5. The quantum-dot-containing photoresist of claim 4, wherein:
the second chemical having an unsaturated bond includes a methacrylate ester, reacting with the alkoxysilane, and
the alkoxysilane includes 3-(triethoxysilyl) propyl methacrylate.

6. The quantum-dot-containing photoresist of claim 1, wherein:

the alkoxysilane includes one or more of n-octyl triethoxysilane, n-octadecyl triethoxysilane, (3-glycidoxypropyl) triethoxysilane, benzyl triethoxysilane silane, and 3-(triethoxysilyl) propyl methacrylate.

7. The quantum-dot-containing photoresist of claim 6, wherein:
the light-diffusion powder is prepared in a form of a microsphere having a diameter of approximately 1 nm to 1 μm.

8. The quantum-dot-containing photoresist of claim 6, wherein:
the light-diffusion powder is prepared to have a polymeric mesh structure.

9. The quantum-dot-containing photoresist of claim 1, including:
approximately 0.1% to 50% by weight of the light-diffusion powder of a total of the quantum-dot-containing photoresist.

10. A quantum-dot-containing color film, comprising a patterned quantum-dot-containing photoresist layer made of the quantum-dot-containing photoresist according to claim 9, wherein the patterned quantum-dot-containing photoresist layer is on a substrate.

11. The quantum-dot-containing photoresist of claim 9, further including:
quantum dots of approximately 0.05% to 50% by weight;
an adhesive of approximately 5% to 45% by weight;
a polymerizable monomer of approximately 0.5% to 18% by weight;
a photo initiator of approximately 0.1% to 3% by weight;
a silane coupling agent of approximately 0.1% to 7% by weight;
additional additives of approximately 0.1% to 3% by weight; and
a solvent of approximately 40% to 85% by weight.

12. The quantum-dot-containing photoresist of claim 11, wherein: the polymerizable monomer includes an acrylic monomer, including at least one of 1, 6-hexanediol diacrylate, dipropylene glycol diacrylate, tripropylene glycol diacrylate, trimethylolpropane triacrylate, ethoxylated yl trimethylol propane triacrylate, pentaerythritol tetraacrylate, tripropylene trimethylolpropane tetraacrylate, or dipentaerythritol pentaacrylate.

13. The quantum-dot-containing photoresist of claim 11, wherein: the additional additives include at least one of a leveling wetting agent, a defoamer, a UV absorber, or a fixing accelerator.

14. The quantum-dot-containing photoresist of claim 11, wherein:
the quantum dot is made of one or more of cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury telluride (HgTe), gallium nitride (GaN), gallium arsenide (GaAs), indium phosphide (InP), and indium arsenide (InAs).

15. The quantum-dot-containing photoresist of claim 14, wherein:
the quantum dot is made by at least two materials that are uniformly mixed, gradient mixed, or that form a core-shell structure.

16. A method for forming a quantum-dot-containing color film, comprising:
initiating a hydrolysis and condensation reaction of an alkoxysilane to produce a light-diffusion powder, the alkoxysilane having a formula (I):

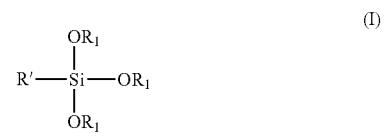

wherein:
$R_1$ includes a C1~C50 alkyl group, and R' includes an alkyl, a substituted alkyl group, and a combination thereof, and
selecting at least one of a photoresist material or the light-diffusion powder, such that the photoresist material and the light-diffusion powder have similar chain segment.

17. The method of claim 16, further including:
mixing the light-diffusion powder, the photoresist material, and quantum dots to form a mixture;
applying the mixture on a substrate to form a quantum-dot-containing photoresist layer; and
patterning the quantum-dot-containing photoresist layer to form the quantum-dot-containing color film including regions corresponding to pixels on the substrate.

18. The method of claim 17, wherein mixing the light-diffusion powder, the photoresist material, and the quantum dots to form the mixture includes: mixing the photoresist material with the quantum dots, followed by adding the light-diffusion powder into a combination of the photoresist material and the quantum dots.

19. The method of claim 16, further including: a vacuum distillation, after initiating the hydrolysis and the condensation reaction of the alkoxysilane.

20. The method of claim 16, wherein:
the light-diffusion powder includes an epoxy structure, and
the photoresist material includes an epoxy resin.

* * * * *